(12) United States Patent
Gong et al.

(10) Patent No.: US 10,727,844 B1
(45) Date of Patent: Jul. 28, 2020

(54) REFERENCE CLOCK FREQUENCY CHANGE HANDLING IN A PHASE-LOCKED LOOP

(71) Applicant: Silicon Laboratories Inc., Austin, TX (US)

(72) Inventors: Xue-Mei Gong, Austin, TX (US); James D. Barnette, Austin, TX (US); Krishnan Balakrishnan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/427,826

(22) Filed: May 31, 2019

(51) Int. Cl.
*H03L 1/02* (2006.01)
*H03L 7/093* (2006.01)
*H03K 5/26* (2006.01)

(52) U.S. Cl.
CPC ............ *H03L 7/093* (2013.01); *H03K 5/26* (2013.01)

(58) Field of Classification Search
USPC .................... 327/147–149, 156–158
See application file for complete search history.

(56) References Cited

U.S. PATENT DOCUMENTS

| | | | |
|---|---|---|---|
| 5,349,310 A | 9/1994 | Rieder | |
| 6,590,426 B2 | 7/2003 | Perrott | |
| 6,711,230 B1 | 3/2004 | Nicholls | |
| 6,741,109 B1 | 5/2004 | Huang et al. | |
| 6,870,411 B2 | 3/2005 | Shibahara | |
| 7,015,738 B1 | 3/2006 | Cao | |
| 7,148,753 B1 * | 12/2006 | Garlepp | H03L 7/07 331/2 |
| 7,271,634 B1 | 9/2007 | Daga | |
| 7,405,628 B2 | 7/2008 | Hulfachor et al. | |
| 7,417,510 B2 | 8/2008 | Huang | |
| 7,463,098 B2 | 12/2008 | Baird et al. | |
| 7,613,267 B2 | 11/2009 | Perrott et al. | |
| 7,777,585 B1 | 8/2010 | Sonntag | |
| 8,441,291 B2 | 5/2013 | Hara et al. | |
| 8,441,575 B2 | 5/2013 | Wang | |
| 8,514,118 B2 | 8/2013 | Eldredge | |
| 8,786,341 B1 | 7/2014 | Weltin-Wu et al. | |
| 8,791,734 B1 * | 7/2014 | Hara | H03L 7/146 327/156 |
| 8,692,599 B2 | 8/2014 | Gong et al. | |
| 9,705,514 B2 | 7/2017 | Perrott | |

(Continued)

OTHER PUBLICATIONS

Silicon Laboratories Inc., "Functional Description," Si5383/84 Rev D Data Sheet, Oct. 2018, 22 pages.

(Continued)

*Primary Examiner* — Adam D Houston
(74) *Attorney, Agent, or Firm* — Zagorin Cave LLP (57) ABSTRACT

A method for operating a phase-locked loop includes generating a phase difference signal based on an input clock signal and a feedback clock signal. The method includes filtering a loop filter input signal based on the phase difference signal to generate a loop filter output signal. The feedback clock signal is based on the loop filter output signal. The method includes transitioning a frequency of an output clock signal of the phase-locked loop from a first frequency to a target frequency responsive to detection of a catastrophic cycle slip event in the absence of an out-of-frequency event.

21 Claims, 7 Drawing Sheets

(56) References Cited

U.S. PATENT DOCUMENTS

| | | |
|---|---|---|
| 10,067,478 B1 | 9/2018 | Ranganathan |
| 10,075,173 B2 | 9/2018 | Sarda |
| 2002/0044620 A1 | 4/2002 | Spijker |
| 2003/0025538 A1 | 2/2003 | Bisanti |
| 2004/0164776 A1* | 8/2004 | Zampetti ............... H03L 7/07 327/156 |
| 2005/0258908 A1 | 11/2005 | Mitric |
| 2006/0171496 A1* | 8/2006 | Nakamuta ............. H03L 7/085 375/376 |
| 2007/0024383 A1 | 2/2007 | Spijker |
| 2007/0182467 A1* | 8/2007 | Nakamuta ............. H03L 1/022 327/156 |
| 2008/0191762 A1* | 8/2008 | Seethamraju ........... G06F 1/04 327/158 |
| 2008/0272810 A1* | 11/2008 | Edwards ............... H03L 7/085 327/156 |
| 2009/0052602 A1 | 2/2009 | Annampedu |
| 2010/0073048 A1 | 3/2010 | Ke |
| 2010/0123491 A1* | 5/2010 | Palmer ................. H03L 7/07 327/156 |
| 2010/0158051 A1 | 6/2010 | Hadzic |
| 2010/0158181 A1 | 6/2010 | Hadzic |
| 2010/0158183 A1 | 6/2010 | Hadzic |
| 2011/0007859 A1 | 1/2011 | Ueda |
| 2011/0032013 A1* | 2/2011 | Nelson ................. B60Q 1/444 327/156 |
| 2012/0007642 A1* | 1/2012 | Miyahara ............. H03L 7/0996 327/156 |
| 2012/0049913 A1 | 3/2012 | Tadijpour |
| 2012/0249195 A1 | 10/2012 | Guo |
| 2013/0057325 A1 | 3/2013 | Dong |
| 2013/0106476 A1 | 5/2013 | Joubert |
| 2014/0118033 A1 | 5/2014 | Anker et al. |
| 2014/0225653 A1* | 8/2014 | Hara ................... H03L 7/235 327/159 |
| 2014/0320181 A1* | 10/2014 | Mitric ................. H03L 7/10 327/156 |
| 2014/0320186 A1 | 10/2014 | Jin et al. |
| 2015/0222273 A1* | 8/2015 | Allan .................. H03L 7/08 327/157 |
| 2015/0222274 A1* | 8/2015 | Cenger ................ G06F 1/10 327/156 |
| 2015/0222276 A1* | 8/2015 | Milijevic ............. H03L 7/087 327/147 |
| 2015/0222280 A1* | 8/2015 | Allan .................. H03L 7/083 327/157 |
| 2015/0364953 A1* | 12/2015 | Rippon ............... H02J 13/0013 327/156 |
| 2016/0065224 A1 | 3/2016 | Galton |
| 2016/0099716 A1 | 4/2016 | Kobayashi |
| 2017/0187481 A1 | 6/2017 | Huang et al. |
| 2018/0262324 A1* | 9/2018 | Creasy ................. H04L 5/0048 |
| 2019/0007055 A1 | 1/2019 | Nelson |

OTHER PUBLICATIONS

Silicon Laboratories Inc., "AN1006: Diffrences Between Si534x/8x Revision B and Revision D Silicon," Data Sheet, Nov. 3, 2016, 8 pages.

Shenoi, K., "An Introduction to Synchronization and Timing in Telecommunications," Qulsar Clocks, Oscillators, and PLLs, WSTS-2013, San Jose, Apr. 16-18, 2013, 73 pages.

\* cited by examiner

REFERENCE CLOCK FREQUENCY CHANGE HANDLING IN A PHASE-LOCKED LOOP

CROSS-REFERENCE TO RELATED APPLICATION(S)

This application is related to U.S. patent application Ser. No. 16/427,837, filed on even date herewith, entitled "GRADUAL FREQUENCY TRANSITION WITH A FREQUENCY STEP," naming Xue-Mei Gong et al. as inventors, which application is hereby incorporated by reference.

BACKGROUND

Field of the Invention

This invention relates to integrated circuits and more particularly to clock generator integrated circuits.

Description of the Related Art

High speed communication systems require high speed clock signals for transmission and reception of information. In a typical clock generation circuit, a phase-locked loop (PLL) receives a synchronization input reference clock signal and generates one or more high speed clock signals suitable for use in transmitting or receiving data. According to one aspect of such a communication system, when the synchronization input reference clock signal is lost, the system enters a mode known as "holdover" mode and continues to output a clock signal.

The accuracy with which the clock generation circuit provides the clock signal in holdover mode is typically specified in a system standard for a target application. The clock generation circuit tries to maintain the output clock signal during holdover mode at a frequency based on a previous reference clock signal. When switching from a free running clock signal to a locked clock signal, entering into a holdover mode, exiting from a holdover mode, or switching an input clock signal from one clock source to another clock source providing another input clock signal having a different frequency, an application may require that the frequency and phase of output clock signal change in a controlled manner. Some applications specify a phase slope limit and a frequency slope limit for the output clock signal. An exemplary specification requires that the maximum rate of frequency change during a pull-in process (i.e., the process of locking a clock signal to another clock signal) is limited to a predetermined value. For example, a specification for a target application has a frequency slope limit of 2.9 ppm/second for a measurement interval of 1 second. However, in some circumstances, satisfying the frequency slope limit specification causes the pull-in process to take a substantial amount of time and cause substantial phase build-up. Accordingly, techniques that reduce the time to complete the clock pull-in process and reduce the phase build-up of a clock generator circuit in response to an event while satisfying change specifications for the output clock signal are desired.

SUMMARY OF EMBODIMENTS OF THE INVENTION

In at least one embodiment, a method for operating a phase-locked loop includes generating a phase difference signal based on an input clock signal and a feedback clock signal. The method includes filtering a loop filter input signal based on the phase difference signal to generate a loop filter output signal. The feedback clock signal is based on the loop filter output signal. The method includes transitioning a frequency of an output clock signal of the phase-locked loop from a first frequency to a target frequency responsive to detection of a catastrophic cycle slip event in the absence of an out-of-frequency event.

In at least one embodiment, a phase-locked loop including a phase detector configured to generate a phase difference signal based on an input clock signal and a feedback clock signal. The phase-locked loop includes a monitor configured to detect a catastrophic cycle-slip event responsive to the phase difference signal and a predetermined number of update periods of the phase difference signal and in the absence of an out-of-frequency event. The phase-locked loop includes a change-limiting loop filter configured to adjust an output frequency signal responsive to the catastrophic cycle-slip event.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
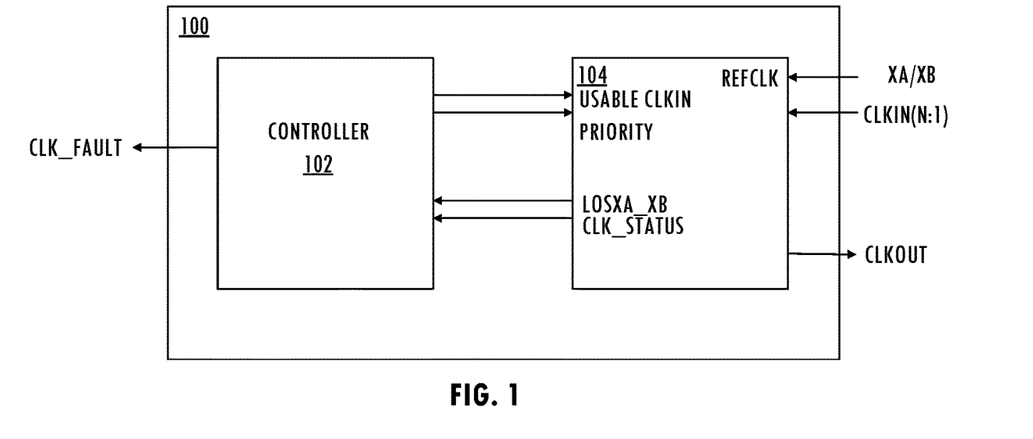
FIG. 1 illustrates a functional block diagram of an exemplary clock product.

Referring to FIG. 1, an embodiment of clock product 100 includes controller 102 and clock generator 104, which monitors at least one received clock signal (e.g., CLKIN(N:1)) using clock signal REFCLK (e.g., a clock signal generated using a crystal oscillator including an external crystal coupled to XA/XB input terminal) and provides at least one output clock signal CLKOUT and at least one clock quality signal. Controller 102 provides configuration information to clock generator 104 using interface signals USABLE_CLKIN and PRIORITY. Clock generator 104 provides clock quality information (e.g., LOSXA_XB or CLK_STATUS) to controller 102, which outputs one or more alarm signals (e.g., CLK_FAULT) based on the clock quality information.

Figure 2:
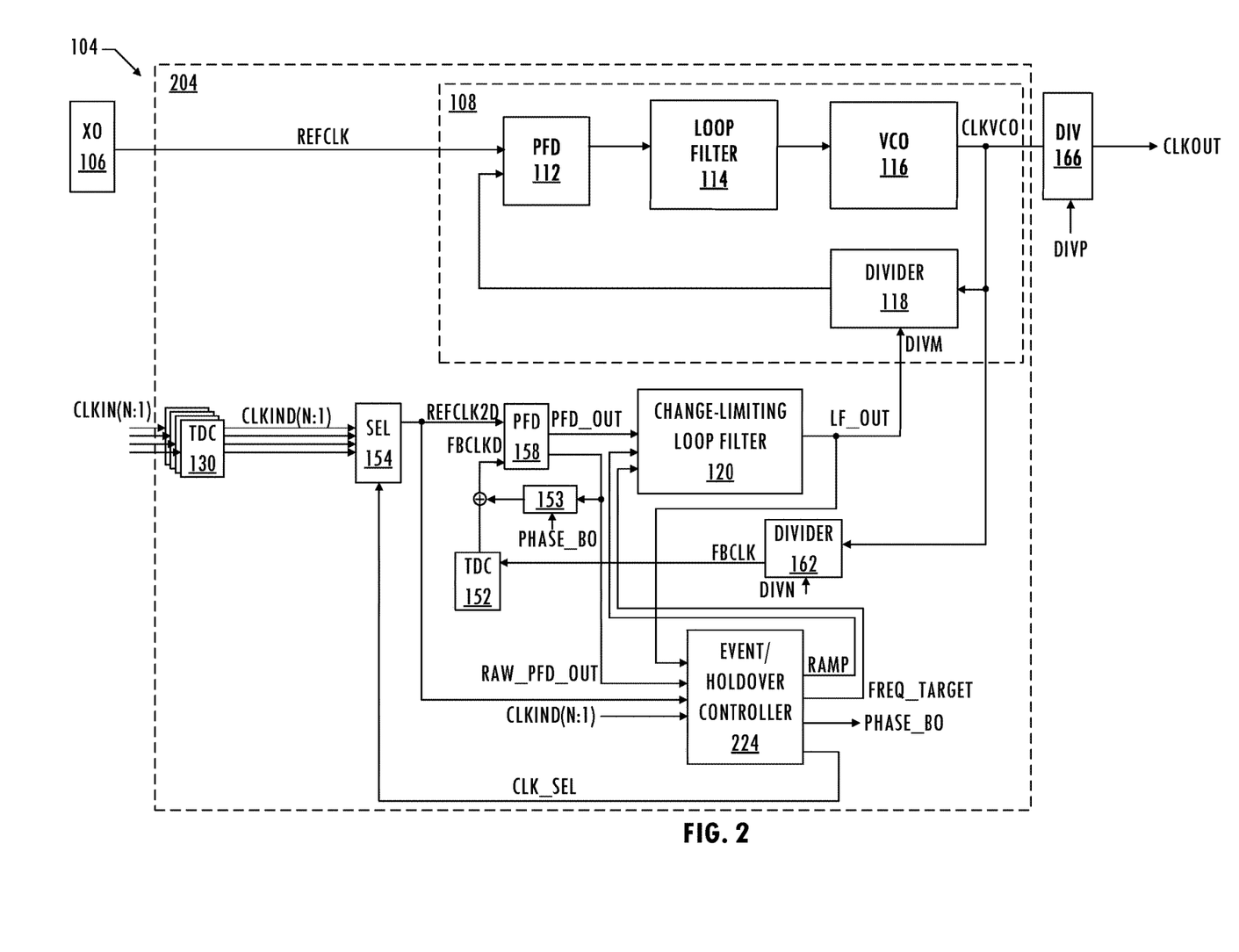
FIG. 2 illustrates a functional block diagram of an exemplary clock generator circuit including a change-limiting loop filter consistent with at least one embodiment of the invention.

FIG. 2 illustrates a functional block diagram of an exemplary clock generator circuit including a change-limiting loop filter. In at least one embodiment, clock generator 104 includes a dual-loop phase-locked loop that generates output clock signal CLKOUT having low jitter, by locking to an input clock signal (e.g., a clock signal selected from input clock signals CLKIN(N:1)) using inner phase-locked loop 108, which is configured as a low-jitter, digitally-controlled. In an embodiment, reference clock source 106 is a fixed source such as a crystal oscillator, a microelectromechanical structure (MEMS) oscillator, or other suitable low-jitter source. Inner phase-locked loop 108, includes phase/frequency detector 112, which generates a phase difference signal based on reference clock signal REFCLK and a feedback signal provided by divider 118. Phase/frequency detector 112 provides the phase difference signal to voltage-controlled oscillator 116 via loop filter 114. Voltage-controlled oscillator 116 may be implemented as a ring oscillator, an LC oscillator, or other suitable oscillator structure.

Outer phase-locked loop 204 includes time-to-digital converters 130 that generate clock signals CLKIND(N:1), which are digital representations of input clock signals CLKIN(N:1). Select circuit 154 selects one of those digital input clock signals according to control signal CLK_SEL and provides the selected digital input clock signal to phase/frequency detector 158 as clock signal REFCLK2D, which is a digital reference clock signal for outer phase-locked loop 204. Outer phase-locked loop 204 includes phase/frequency detector 158, change-limiting loop filter 120, and divider 162, and uses inner phase-locked loop 108 as a digitally controlled oscillator responsive to digital divider ratio DIVM, which is an integer divider value or a fractional divider value. Phase/frequency detector 158 receives clock signal REFCLK2D and feedback clock signal FBCLKD. Time-to-digital converter 152 provides feedback clock signal FBCLKD, which is a digital version of feedback clock signal FBCLK. Feedback clock signal FBCLK is a frequency-divided version of clock signal CLKVCO. Phase/frequency detector 158 provides phase difference signal RAW_PFD_OUT generated based on the difference between clock signal REFCLK2D and feedback clock signal FBCLKD, and another phase difference signal PFD_OUT also generated based on the difference between clock signal REFCLK2D and feedback clock signal FBCLKD. The range of phase difference signal PFD_OUT is within +/−1/$f_{PFD}$, where $f_{PFD}$ is the update rate of phase/frequency detector 158. The range of phase difference signal RAW_PFD_OUT can be greater than +/−1/$f_{PFD}$ and is the total phase difference between clock signal REFCLK2D and feedback clock signal FBCLKD starting from a time, e.g., the start of locking to clock signal REFCLK2D. In at least one embodiment, phase/frequency detector 158 is a digital phase detector that provides digital difference signal PFD_OUT to change-limiting loop filter 120, which generates a loop filter output signal LF_OUT. Change-limiting loop filter 120 provides loop filter output signal LF_OUT to inner loop 108 as divider ratio DIVM that controls divider 118. In at least one embodiment, time-to-digital converters 130 and 152 are implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference.

The frequency of reference clock signal REFCLK and divider ratio DIVM provided by outer phase-locked loop 204 to divider 118 in the feedback path of inner phase-locked loop 108 determine the frequency of clock signal CLKVCO. Outer phase-locked loop 204 adjusts divider ratio DIVM to match the frequency of clock signal CLKVCO ($f_{CLKVCO}$) to a multiple (divider ration DIVN) of the frequency of the selected input clock signal of input clock signals CLKIN(N:1) (e.g., $f_{CLKIN(n)}=f_{CLKVCO}/DIVN$, where $f_{CLKIN(n)}$ is the frequency of selected input clock signal CLKIN(n), which corresponds to clock signal REFCLK2D). In an embodiment of clock generator 104, outer phase-locked loop 204 provides clock signal CLKVCO to output divider 166, which is responsive to divider control signal DIVP. In at least one embodiment of output divider 166, divider control signal DIVP is a digital frequency ratio translated from a code, e.g., a code provided by non-volatile memory or other storage element. In other embodiments of clock generator 104, voltage-controlled oscillator 116 provides clock signal CLKVCO as output clock signal CLKOUT and output divider 166 is disabled or excluded.

In at least one embodiment of clock generator 104, event/holdover controller 224 determines whether selected input clock signal CLKIN(n), which is selected from input clock signals CLKIN(N:1), and digitized by time-to-digital converters 130, exists and/or whether the frequency of selected input clock signal CLKIN(n) is within a target frequency range. If either the frequency of selected input clock signal CLKIN(n) is out of the target frequency range, a loss-of-signal condition is detected, or a substantial phase difference is detected, event/holdover controller 224 determines that selected input clock signal CLKIN(n) is invalid. If selected input clock signal CLKIN(n) is invalid and event/holdover controller 224 determines that no other input clock signals are valid, event/holdover controller 224 triggers the holdover mode. Event/holdover controller 224 freezes loop filter output signal LF_OUT provided by change-limiting loop filter 120 to prevent divider ratio DIVM from tracking further changes to clock signal REFCLK2D, and selects a stored averaged output of change-limiting loop filter 120 or a stored value based on an output signal of change-limiting loop filter 120 as target value FREQ_TARGET provided as input to change-limiting loop filter 120, thereby holding the frequency of clock signal CLKVCO at a steady frequency value. For example, event/holdover control 224 of outer phase-locked loop 204 holds the output signal of change-limiting loop filter 120 at a value corresponding to an output of phase/frequency detector 158 received by change-limiting loop filter 120 prior to entering the holdover mode to prevent updating of DIVM. In at least one embodiment of clock generator 104, during holdover mode event/holdover controller 224 provides change-limiting loop filter 120 with a target value FREQ_TARGET that causes output clock signal CLKOUT to achieve a target frequency and is an average value or other function of a stored value of the output of phase/frequency detector 158. The stored value is stored prior to entering the holdover mode. Freezing divider ratio DIVM provided to divider 118 causes the output frequency of clock signal CLKVCO to vary only based on frequency variation of clock signal REFCLK. Meanwhile, event/holdover controller 224 also updates control signal CLK_SEL to select an output of time-to-digital converters 130 to provide as input clock signal CLKIN for use upon exiting the holdover mode.

Figure 3:
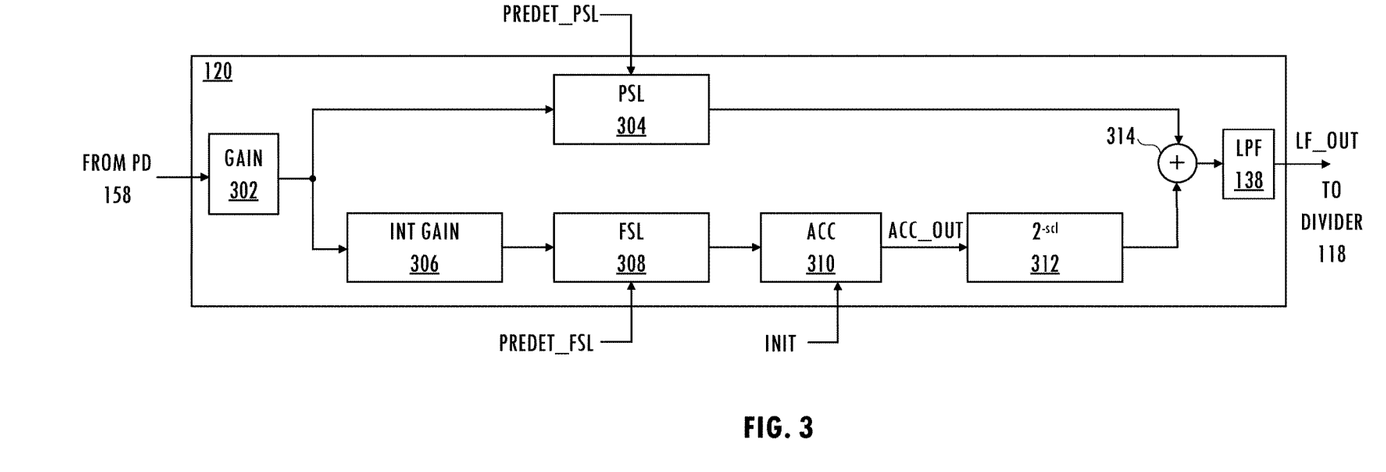
FIG. 3 illustrates a functional block diagram of an exemplary change-limiting loop filter of the clock generator circuit of FIG. 2 configured in a first mode of operation consistent with at least one embodiment of the invention.

In at least one embodiment, change-limiting loop filter 120 limits a phase change and a frequency change of an output clock signal in response to pull-in events (e.g., after a switch of the selected input clock signal from selected input clock signal CLKIN(n) to another of input clock signals CLKIN(N:1) by select circuit 154, or after the frequency of selected input clock signal CLKIN(n) changes abruptly). Target applications specify a maximum rate of frequency change and maximum rate of phase change of output clock signal CLKOUT during the pull-in process. An exemplary predetermined frequency slope limit PREDET_FSL is 2.9 ppm/second for a measurement interval of one second and an exemplary predetermined phase slope limit PREDET_PSL is 0.3125 µs/s within 164 ms. In response to a pull-in event, change-limiting loop filter 120 limits the rate of change in phase of output clock signal CLKOUT and limits the rate of change in frequency of output clock signal CLKOUT to cause the frequency of output clock signal CLKOUT to gradually transition between frequencies. FIG. 3 illustrates a functional block diagram of exemplary change-limiting loop filter 120. In at least one embodiment, change-limiting loop filter 120 includes gain circuit 302, which applies a gain factor to the output of phase/frequency detector 158 during closed-loop operation of clock generator 104. Phase slope limiter 304 compares the gained phase difference signal to predetermined phase slope limit PREDET_PSL. If the gained phase difference signal is less than predetermined phase slope limit PREDET_PSL, phase slope limiter 304 provides the gained phase difference signal to summing circuit 314. If the gained phase difference signal is greater than predetermined phase slope limit PREDET_PSL, phase slope limiter 304 provides predetermined phase slope limit PREDET_PSL to summing circuit 314, thereby limiting the change in phase of output clock signal CLKOUT.

In a signal path that is coupled in parallel with phase slope limiter 304, integrator gain 306 applies another gain factor (e.g., a power of two) to the gained phase difference signal received from gain circuit 302. If the gained phase difference value is greater than predetermined frequency slope limit PREDET_FSL, frequency slope limiter 308 provides predetermined frequency slope limit PREDET_FSL to accumulator 310. If the gained phase difference value is less than predetermined frequency slope limit PREDET_FSL, frequency slope limiter 308 provides the gained phase difference signal to accumulator 310. In closed-loop operation, accumulator 310 sums values of the gained phase difference signal over time to obtain a frequency shift value. Scaler 312 adjusts the output of accumulator 310 and provides the scaled accumulator output to summing circuit 314 for combination with the output of phase slope limiter 304. Summing circuit 314 provides the resulting combination to low-pass filter 138, which low-pass filters the phase-change limited and frequency-change limited output signal to generate a corresponding digital control signal for inner loop 108. Event/holdover controller 224 updates a stored value based on the output of change-limiting loop filter 120 for later use during other modes of operation (e.g., an open-loop mode of operation).

Figure 4:
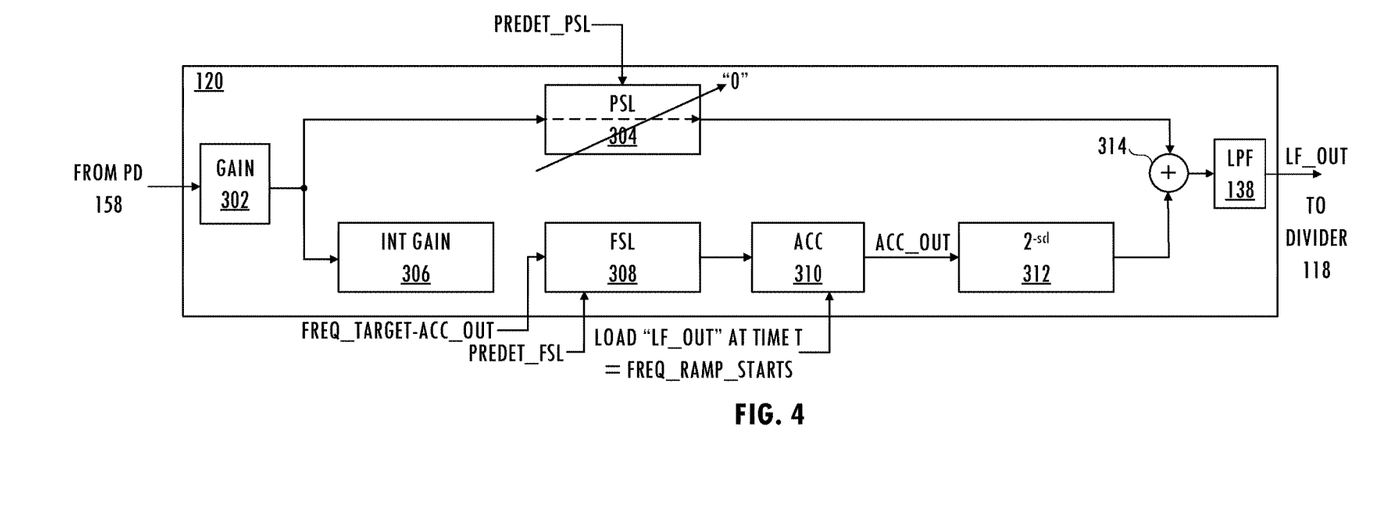
FIG. 4 illustrates a functional block diagram of an exemplary change-limiting loop filter of the clock generator circuit of FIG. 2 configured in a second mode of operation in response to an event consistent with at least one embodiment of the invention.
Figure 5:
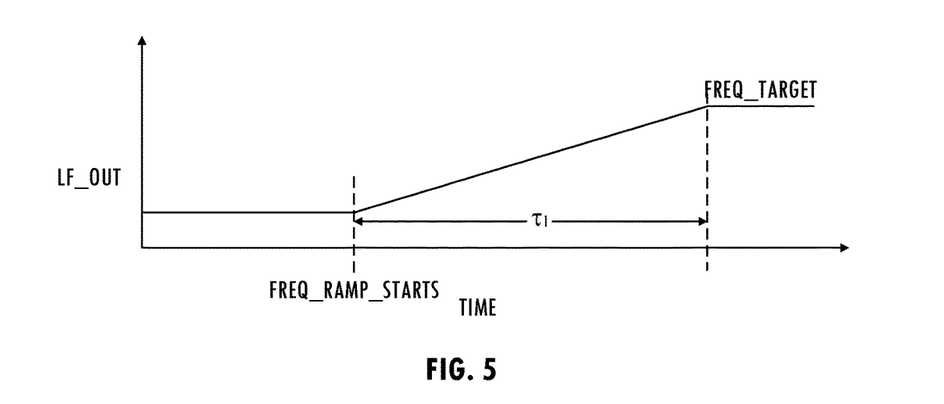
FIG. 5 illustrates an exemplary waveform for a loop filter output signal as a function of time generated by a change-limiting loop filter implementing a gradual frequency increase of an output clock signal of FIG. 2 consistent with at least one embodiment of the invention.

Referring to FIGS. 2, 4, and 5, in at least one embodiment, in response to detecting an event, event/holdover controller 224 configures outer phase-locked loop 204 in an open-loop configuration and enables a gradual transition (e.g., switching from a free running clock signal to a locked clock signal, entering into a holdover mode of operation, exiting from a holdover mode of operation, switching an input clock signal from one clock source to another clock source providing another input clock signal having a different frequency, or a catastrophic cycle slip event in the absence of an out-of-frequency event). In response to control signal RAMP, outer phase-locked loop 204 gradually transitions output clock CLKOUT to a new frequency. In open-loop operation, when gradually transitioning the frequency of output clock signal CLKOUT, event/holdover controller 224 effectively disables phase slope limiter 304 (e.g., phase slope limiter 304 provides zero output or phase slope limited 304 is decoupled from summing circuit 314). Change-limiting loop filter 120 gradually transitions the frequency of output clock signal CLKOUT from a current frequency of output clock signal CLKOUT to target value FREQ_TARGET based on selected input clock signal CLKIN(n) or based on a stored value corresponding to the historical input clock average frequency data for entering holdover mode. At the start of the gradual transition (i.e., time FREQ_RAMP_STARTS), event/holdover controller 224 loads accumulator 310 with a suitably scaled version of loop filter output LF_OUT.

Figure 6:
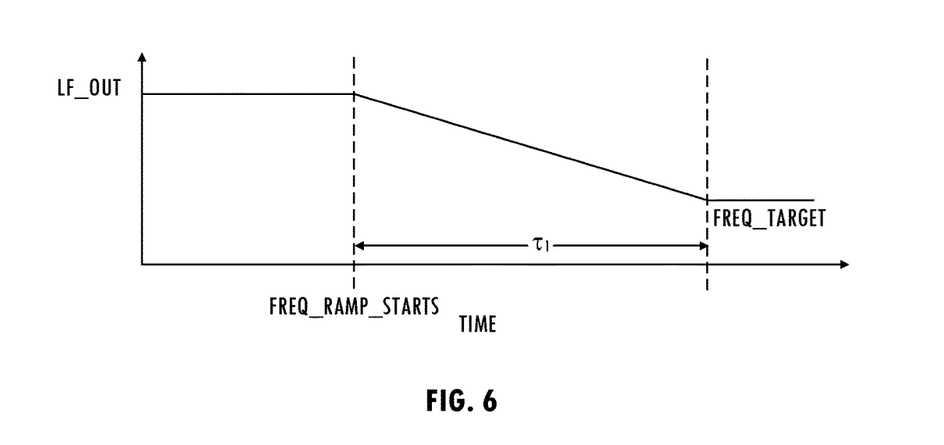
FIG. 6 illustrates an exemplary waveform for a loop filter output signal as a function of time generated by a change-limiting loop filter implementing a gradual frequency decrease of an output clock signal of FIG. 2 consistent with at least one embodiment of the invention.

During a gradual transition, event/holdover controller 224 continuously drives frequency slope limiter 308 with an updated difference between target value FREQ_TARGET and a signal corresponding to the frequency of the reference clock signal (e.g., output of accumulator 310). When the magnitude of the difference is less than predetermined frequency slope limit PREDET_FSL, frequency slope limiter 308 provides that difference to accumulator 310. When the magnitude of the difference is greater than predetermined frequency slope limit PREDET_FSL, frequency slope limiter 308 provides the predetermined frequency slope limit PREDET_FSL as an operand to accumulator 310 until the magnitude of the difference is less than predetermined frequency slope limit PREDET_FSL. When the magnitude of the difference is less than predetermined frequency slop limit PREDET_FSL, frequency slope limiter 308 provides that difference to accumulator 310. When the frequency of selected input clock signal CLKIN(n) is greater than the frequency of feedback clock signal FBCLK, the output of the loop filter as a function of time gradually increases (e.g., linearly increases or monotonically increases) to a target value FREQ_TARGET, as illustrated in FIG. 5. When the frequency of the input clock signal is less than the frequency of feedback clock signal FBCLK, the output of change-limiting loop filter 120 as a function of time gradually decreases to a lower target value FREQ_TARGET (e.g., linearly decreases or monotonically decreases), as illustrated in FIG. 6. For a predetermined frequency slope limit PREDET_FSL, transition time $\tau_1$ can be substantial and can cause a substantial phase build-up (i.e., a substantial constant phase difference).

A technique for reducing the transition time and phase build-up caused by a gradual phase or frequency transition includes introducing a frequency step at the beginning of the gradual frequency transition, which is allowed by a specification of a target application. Referring to FIGS. 2, 7, 8, and 9, in at least one embodiment, in response to an event (e.g., switching from a free running clock signal to a locked clock signal, entering into a holdover mode of operation, exiting from a holdover mode of operation, or switching an input clock signal from one clock source to another clock source providing another input clock signal having a different frequency), event/holdover controller 224 configures outer phase-locked loop 204 in an open-loop configuration and enables a gradual frequency transition with a frequency step (e.g., sets step control signal ENABLE '1'). Change-limiting loop filter 120 introduces the frequency step by initializing accumulator 310 at time FREQ_RAMP_STARTS with a combination of loop filter output LF_OUT and frequency step value STEP. Frequency step value STEP is added to loop filter output LF_OUT if the frequency transition increases the frequency of output clock signal CLKOUT and frequency step value STEP is subtracted from loop filter output LF_OUT if the frequency transition decreases the frequency of output clock signal CLKOUT. In at least one embodiment, frequency step value STEP has a predetermined value that corresponds to a frequency step with a magnitude less than or equal to phase slope limit PREDET_PSL. If frequency step value STEP is larger than the absolute value of loop filter output LF_OUT, accumulator 310 is loaded with target value FREQ_TARGET directly to avoid frequency overshoot. After initialization, which applies the frequency step value, if the target frequency has not been achieved by output clock signal CLKOUT, accumulator 310 applies the operand provided by frequency slope limiter 308. The sign of the applied operand is determined by change-limiting loop filter 120 based on the values of loop filter output LF_OUT and target value FREQ_TARGET. In at least one embodiment, the operand has a value that corresponds to a frequency slope limit PREDET_FSL.

Figure 8:
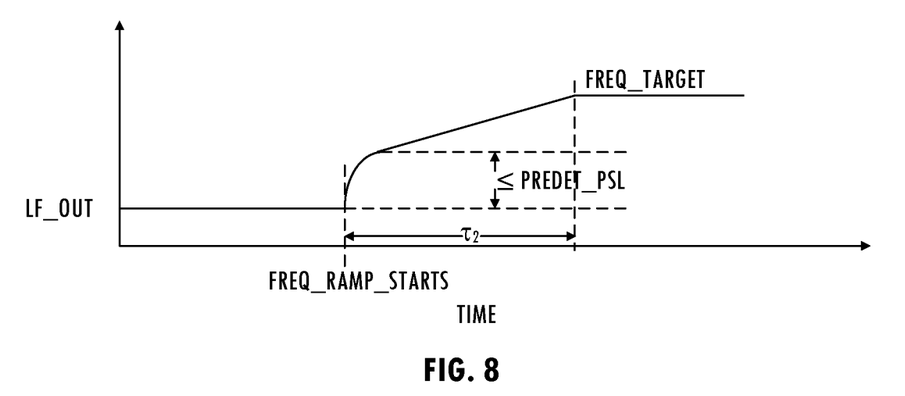
FIG. 8 illustrates an exemplary waveform for a loop filter output signal as a function of time generated by a change-limiting loop filter implementing a frequency step and gradual frequency increase of an output clock signal of FIG. 2 consistent with at least one embodiment of the invention.
Figure 9:
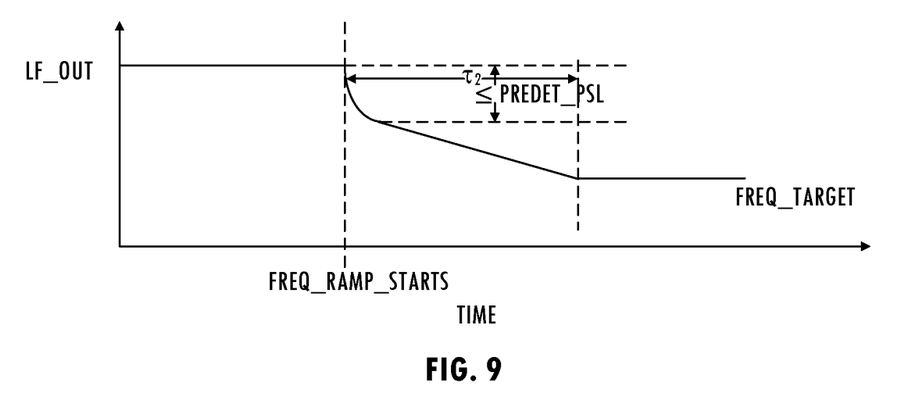
FIG. 9 illustrates an exemplary waveform for a loop filter output signal as a function of time generated by a change-limiting loop filter implementing a frequency step and gradual frequency decrease of an output clock signal of FIG. 2 consistent with at least one embodiment of the invention.

Since the output of accumulator 310 is indirectly coupled to low pass filter 138, change-limiting loop filter 120 provides a nonlinear, but continuous signal to inner loop 108. FIG. 8 illustrates exemplary loop filter output as a function time in response to the target frequency being greater than the frequency of output clock signal CLKOUT (i.e., the current frequency) when the frequency transition is enabled. FIG. 9 illustrates exemplary loop filter output as a function time in response to the frequency of output clock signal CLKOUT being greater than the target frequency when the frequency transition is enabled. Referring to FIGS. 5, 6, 8 and 9, the transition time $\tau_2$ realized by a gradual frequency transition with a frequency step is substantially less than transition time $\tau_1$ realized by a gradual frequency transition without a frequency step and the applied operand introduces a nonlinear change in the loop filter output signal that has a magnitude less than or equal to a corresponding predetermined phase slope limit PREDET_PSL, and a linear transition with a slope less than or equal to predetermined frequency slope limit PREDET_PSL.

Figure 10:
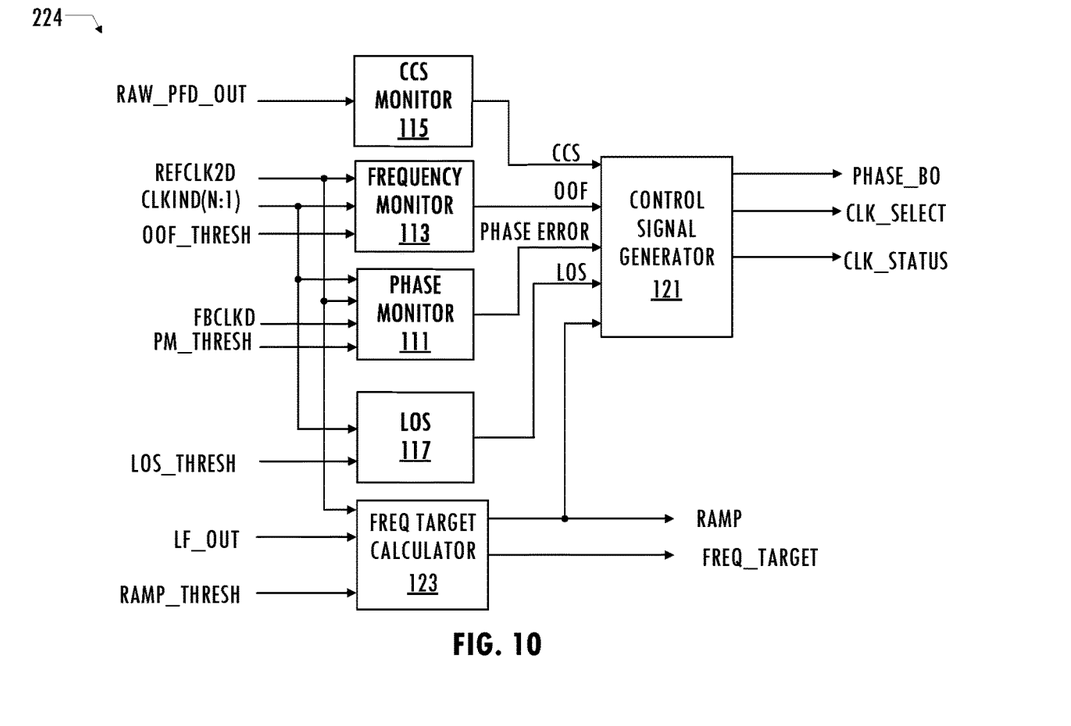
FIG. 10 illustrates a functional block diagram of an exemplary event/holdover controller of the clock generator of FIG. 2.

Referring to FIGS. 2 and 10, in at least one embodiment, clock generator 104 includes event/holdover controller 224, which detects events and generates control signals associated with those events. For example, in at least one embodiment of clock generator 104 event/holdover controller 224 monitors clock signal REFCLK2D and detects out-of-frequency (OOF) events, phase error events, and loss-of-signal (LOS) events and generates associated control signals (e.g., control signals to select a source to provide clock signal REFCLK2D, to enable holdover mode, disable holdover mode, or to enable gradual frequency transitioning). Frequency monitor 113 generates an indication of whether input clock signals CLKIN(N:1) have a frequency in the range associated with clock signal REFCLK2D based on corresponding digital values (e.g., input clock signals CLKIND(N:1) and clock signal REFCLK2D) and a predetermined frequency difference threshold OOF_THRESH. If the frequency difference associated with clock signal CLKIND(n) and clock signal REFCLK2D is greater than predetermined frequency difference threshold OOF_THRESH, frequency monitor indicates detection of an out-of-frequency event. Phase monitor 111 generates an indication of a phase error between the selected input clock signal CLKIND(n) and the feedback clock signal indicated by digital value REFCLK2D exceeding a predetermined phase difference threshold PM_THRESH.

Loss-of-signal detector 117 determines whether selected input clock signal CLKIN(n) is present based on clock signal CLKIND(n) and threshold LOS_THRESH. If either the frequency of selected input clock signal CLKIN(n) is out of the target frequency range or a loss-of-signal condition is detected, control signal generator 121 generates corresponding control signals or an indication that selected input clock signal CLKIN(n) has failed. If event/holdover controller 224 detects an event and triggers holdover mode, frequency target calculator 123 generates target value FREQ_TARGET based on historical input clock average frequency data stored in a storage element. Event/holdover controller 224 configures change-limiting loop filter 120 for open-loop mode and provides target value FREQ_TARGET to change-limiting filter 120. Under some circumstances, instead of entering holdover mode in response to an event, event/holdover controller 224 updates clock select signal CLK_SEL to a next input clock signal, which may be the same clock signal or another clock signal received by select circuit 154. If event/holdover controller 224 detects an event and updates clock select signal CLK_SEL to switch the input clock signal to another valid clock signal received by select circuit 154, frequency target calculator 123 generates target value FREQ_TARGET based on the average frequency of selected input clock signal CLKIN(n). Event/holdover controller 224 configures change-limiting loop filter 120 for open-loop mode and provides target value FREQ_TARGET to change-limiting filter 120. If event/holdover controller 224 does not detect an event, event/holdover controller 224 configures change-limiting loop filter 120 to provide a dynamically updated output to inner phase-locked loop 108. In an embodiment, event/holdover controller 224 is implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

Figure 11:
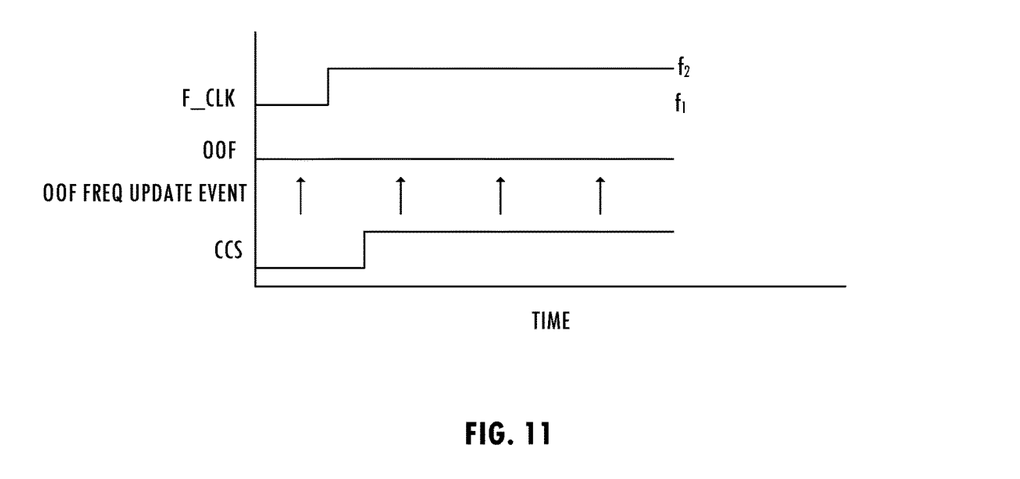
FIG. 11 illustrates exemplary timing diagrams for events in the clock generator circuit of FIG. 2 consistent with at least one embodiment of the invention.

In at least one embodiment of clock generator 104, selected input clock signal CLKIN(n) is within the target frequency range (i.e., frequency monitor does not detect an out-of-frequency event), but selected input clock signal CLKIN(n) experiences a clock frequency nonlinearity including a substantial change in frequency (i.e., a frequency change that is large enough to cause a catastrophic cycle slip event). Catastrophic cycle slip monitor 115 compares phase difference signal RAW_PFD_OUT to a predetermined number of unit intervals of the update rate $f_{PFD}$ of phase/frequency detector 158. The predetermined number corresponds to a frequency change of selected input clock signal CLKIN(n) that is too large for outer phase-locked loop 204, i.e., a frequency difference outside the loop bandwidth of outer phase-locked loop 204. The catastrophic cycle slip event is illustrated in FIG. 11. The frequency of selected input signal CLKIN(n), frequency F_CLK, jumps from $f_1$ to $f_2$, where $f_2-f_1$ is within the limits of OOF_THRESH. Therefore, event/holdover controller 224 does not trigger an out-of-frequency event. Meanwhile, frequency monitor 113 measures the selected clock period in the background (e.g., using a time-to-digital converter controlled using a frequency-stable input clock signal and a comparator) and provides an updated value for each occurrence of an out-of-frequency update event. The measured value is the average of frequency F_CLK between two adjacent occurrences of out-of-frequency update events. Note that frequency F_CLK is not a measured value. As frequency F_CLK changes occur between the first and second out-of-frequency update events, over time, the phase difference between feedback clocks signal FBCLKD and clock signal REFCLKD increases if the bandwidth of outer phase-locked loop 204 is sufficiently narrow. When the phase difference signal RAW_PFD_OUT exceeds a predetermined number of update periods of the phase difference signal (e.g., $1/f_{PFD} \times$ UI, where UI is a programmed integer number), catastrophic cycle slip monitor 115 triggers a catastrophic cycle slip event.

In response to detecting a catastrophic cycle slip event in the absence of an out-of-frequency event (i.e., F_CLK is within a predetermined frequency range), event/holdover controller 224 triggers a clock switch event to the same active clock (i.e., selected input clock signal CLKIN(n)). Note that in response to the catastrophic cycle slip event in the absence of an out-of-frequency event, control signal CLK_SEL does not change, but event/holdover controller 224 configures change-limiting loop filter 120 to transition the frequency of feedback clock signal FBCLK from frequency $f_1$ to frequency $f_2$. In response to detecting an out-of-frequency event, event/holdover controller 224 triggers either a clock switch to another clock signal (e.g., changes control signal CLK_SEL to select another of input clock signals CLKIN(N:1)) or triggers holdover mode and may eventually return to the currently selected active clock signal.

Figure 12:
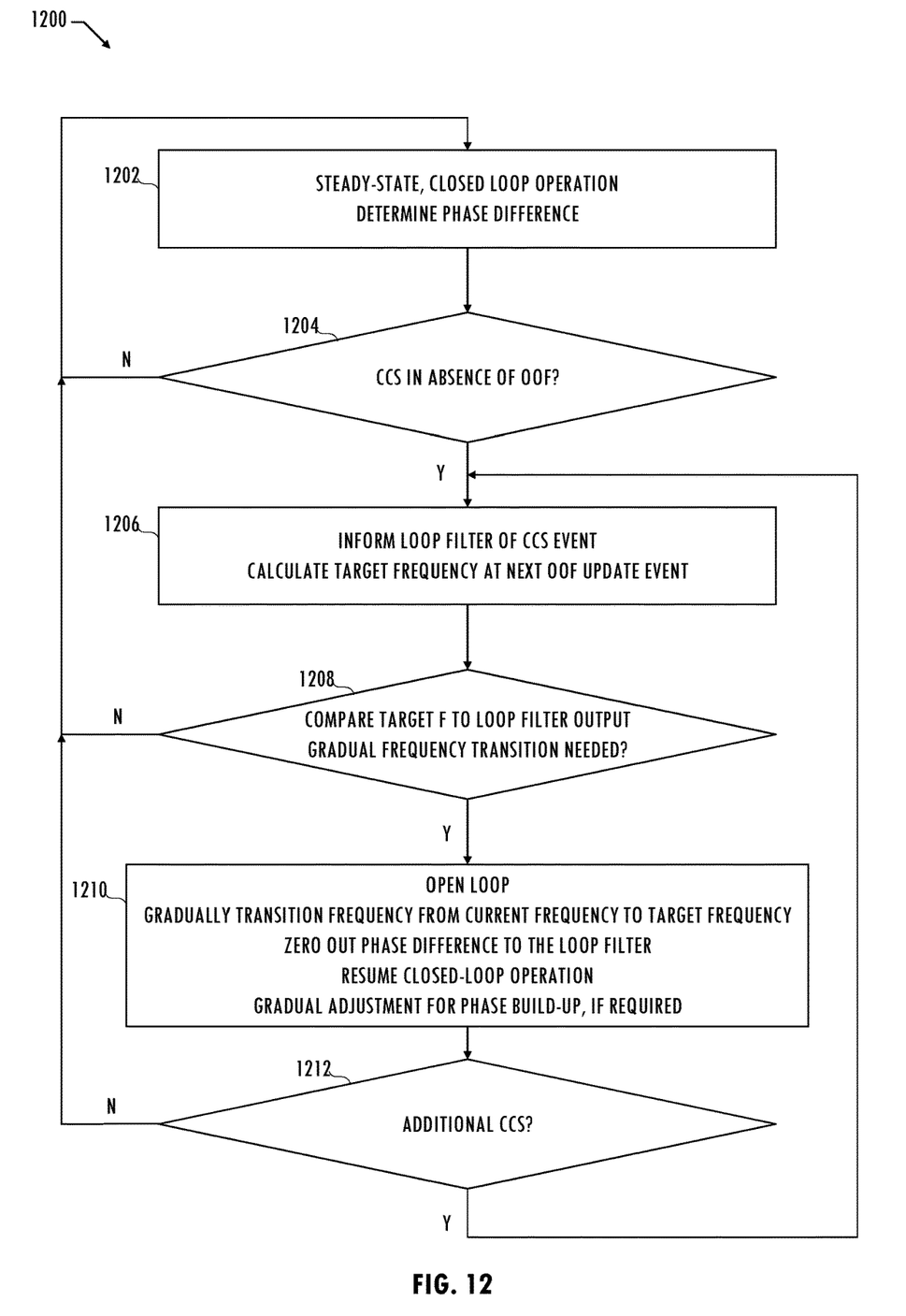
FIG. 12 illustrates exemplary information and control flows for the clock generator circuit of FIG. 2 consistent with at least one embodiment of the invention.

Referring to FIGS. 2, 10, and 12, in at least one embodiment, event/holdover controller 224 generates control signals to configure clock generator 104 consistent with information and control flow 1200. While clock generator 104 operates in closed-loop operation, phase/frequency detector 158 updates phase difference signal RAW_PFD_OUT and phase difference signal PFD_OUT (1202). Event/holdover controller 224 determines whether a catastrophic cycle slip event has occurred in the absence of an out-of-frequency event (e.g., by comparing the phase difference signal RAW_PFD_OUT to a value corresponding to a predetermined number of unit intervals of the update rate $f_{PFD}$ of phase/frequency detector 158 (1204). In the absence of a catastrophic cycle slip event and in the absence of any other event, event/holdover controller 224 maintains clock generator 104 in closed-loop operation (1202). If event/holdover controller 224 detects a catastrophic cycle slip event in the absence of an out-of-frequency event, event/holdover controller 224 indicates to change-limiting loop filter 120 that the catastrophic cycle slip event occurred and event/holdover controller 224 determines target value FREQ_TARGET at a next occurrence of an out-of-frequency update event based on a next measurement of the average frequency of selected input clock signal CLKIN(n) (1206).

Frequency target calculator 123 determines whether rearrangement of clock generator 104 should include a gradual frequency transition (with or without a frequency step) based on a comparison of the magnitude of a difference between the target value FREQ_TARGET and the loop filter output to threshold RAMP THRESH, which is a predetermined transition threshold value (1208). If frequency target calculator 123 determines that a gradual frequency transition is not needed (e.g., the difference is less than threshold RAMP THRESH and the difference is within the bandwidth of outer phase-locked loop 204), then outer phase-locked loop 204 continues to operate in a closed-loop configuration (1202).

Figure 7:
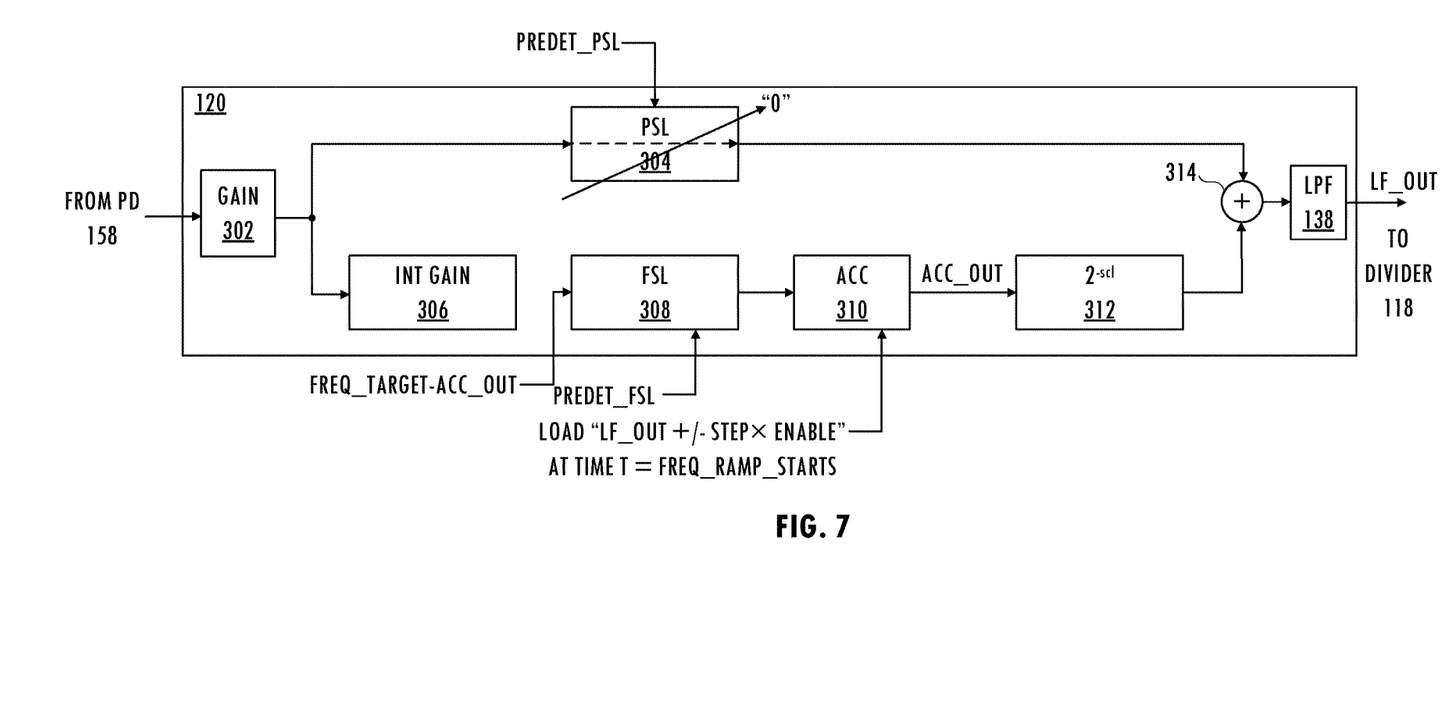
FIG. 7 illustrates a functional block diagram of an exemplary change-limiting loop filter implementing a gradual frequency increase with a frequency step of an output clock signal of FIG. 2 consistent with at least one embodiment of the invention.

If event/holdover controller 224 determines that a gradual frequency transition should occur (e.g., the difference is greater than the predetermined transition threshold value and the difference exceeds the bandwidth of outer phase-locked loop 204), then event/holdover controller 224 opens outer phase-locked loop 204 and configures change-limiting loop filter 120 as described in FIG. 7 to gradually transition the frequency of output clock signal CLKOUT from the current frequency to target value FREQ_TARGET.

Referring back to FIG. 12, after output clock signal CLKOUT achieves the target frequency, event/holdover controller 224 saves the value of a phase difference in storage element 153, which in at least one embodiment is a counter, and zeros the phase difference signal provided to change-limiting loop filter 120 before resuming closed-loop operation. Then, if required by a target application, event/holdover controller 224 gradually aligns the clock signal REFCLKD and feedback clock signal FBCLKD by gradually adding the phase difference stored in storage element 153 to an input of phase/frequency detector 158 (1210). In at least one embodiment, event/holdover controller 224 gradually aligns the clock signals by incrementally adding the stored phase difference to clock signal REFCLKD and to decrement storage 153 until storage 153 equals zero (e.g., using control signal PHASE_BO). In other embodiments, the phase difference is applied to the feedback path (i.e., feedback clock signal FBCLKD) and storage 153 decrements with each increment to feedback clock signal FBCLKD until storage 153 equals zero. As a result, edges of input clock signal CLKIN and clock signal FBCLK are gradually aligned and any phase-build up is reduced or eliminated.

Calculation of target value FREQ_TARGET based on the measured selected input clock period at a second event of FIG. 11 introduces error into target value FREQ_TARGET. Referring back to FIG. 12, under some circumstances, that error of target value FREQ_TARGET is sufficiently large, and the magnitude of the frequency difference between the selected input clock signal and clock signal FBCLK is still sufficiently large. Thus, event/holdover controller 224 may detect a second catastrophic cycle slip after resuming closed-loop operation of outer phase-locked loop 204 (1212). Accordingly, event/holdover controller 224 performs a second catastrophic cycle slip response sequence (1206, 1208, 1210, 1212). If event/holdover controller 224 does not detect a second catastrophic cycle slip event, then closed-loop operation continues (1202). The information and control flows of FIG. 12 are exemplary only and other embodiments of clock generator 104 use other sequences of steps or additional steps that do not affect data dependencies.

In general, predetermined values (e.g., phase slope limit, frequency slope limit, predetermined step, and threshold values) are fixed during manufacture or production test of clock product 100 or are defined by a user. As referred to herein, a user is an application (e.g., configuration software) executing on a processor (e.g., executing on controller 102 or a controller external to clock product 100) to configure clock product 100 or clock generator 104, or a person manually configuring clock product 100 for operation. Thus, techniques for a clock product handling of relatively large changes in frequency of an active input clock signal have been described. Techniques described herein improve phase continuity or reduce amount of open-loop operation in some applications.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the invention has been described in an embodiment in which clock generator 104 uses a dual-loop phase-locked loop, one of skill in the art will appreciate that the teachings herein can be utilized with clock generators including other numbers of cascaded phase-locked loops. In addition, although the invention has been described in an embodiment in which outer phase-locked loop 204 of clock generator 104 controls the divider value used by divider 118 of inner loop 108 and output divider 166 receives divider control signal DIVP, one of skill in the art will appreciate that the teachings herein can be utilized with outer phase-locked loop 204 controlling a divider control signal DIVP of an output divider responsive to CLKVCO and divider 118 is responsive to a predetermined divider value.

The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A method for operating a phase-locked loop comprising:
   generating a phase difference signal based on an input clock signal and a feedback clock signal;
   filtering a loop filter input signal based on the phase difference signal to generate a loop filter output signal, the feedback clock signal being based on the loop filter output signal; and
   transitioning a frequency of an output clock signal of the phase-locked loop from a first frequency to a target frequency responsive to detection of a catastrophic cycle slip event in the absence of an out-of-frequency event.

2. The method, as recited in claim 1, wherein the catastrophic cycle slip event is detected responsive to a substantial frequency change of the input clock signal.

3. The method, as recited in claim 1, wherein the catastrophic cycle slip event is detected responsive to the phase difference signal exceeding a predetermined number of update periods of the phase difference signal.

4. The method, as recited in claim 3, further comprising:
   comparing a value of the phase difference signal to the predetermined number of update periods of the phase difference signal; and
   generating a catastrophic cycle slip detection signal based on the comparing.

5. The method, as recited in claim 1, further comprising:
   storing a value of the phase difference signal after the frequency of the output clock signal reaches the target frequency in response to the detection of the catastrophic cycle slip event; and
   incrementally adjusting the phase difference signal and decrementing the stored value of the phase difference signal to gradually zero out a phase difference between the input clock signal and the feedback clock signal.

6. The method, as recited in claim 5, further comprising:
   resuming closed-loop operation after setting the phase difference signal to zero; and
   detecting an additional cycle slip event in the absence of an out-of-frequency event and immediately after resuming the closed-loop operation.

7. The method, as recited in claim 1, further comprising:
   detecting the catastrophic cycle slip event based on the phase difference signal and a predetermined number of update periods of the phase difference signal.

8. The method, as recited in claim 1, wherein the transitioning comprises:
   calculating a target loop filter output value based on a next measured average input clock frequency; and
   selectively ramping the loop filter output signal to the target loop filter output value based on a comparison of the target loop filter output value to the loop filter output signal.

9. The method, as recited in claim 8, wherein the transitioning comprises:
   zeroing the phase difference signal after the loop filter output signal achieves the target loop filter output value and before configuring the phase-locked loop for closed-loop operation.

10. A phase-locked loop comprising:
    a phase detector configured to generate a phase difference signal based on an input clock signal and a feedback clock signal;
    a monitor configured to detect a catastrophic cycle-slip event responsive to the phase difference signal and a predetermined number of update periods of the phase difference signal and in the absence of an out-of-frequency event; and
    a change-limiting loop filter configured to adjust an output signal responsive to the catastrophic cycle-slip event.

11. The phase-locked loop, as recited in claim 10, wherein the change-limiting loop filter is configured to ramp the output signal from a value associated with a first frequency of a phase-locked loop output signal to a target value associated with a target frequency of the phase-locked loop output signal responsive to a difference between the target frequency and the first frequency being greater than a predetermined frequency threshold.

12. The phase-locked loop, as recited in claim 10, wherein the catastrophic cycle-slip event is detected responsive to a substantial frequency change of the input clock signal.

13. The phase-locked loop, as recited in claim 10, further comprising:
a comparator configured to generate a catastrophic cycle slip detection signal based on a comparison of a value of the phase difference signal to the predetermined number of update periods of the phase difference signal.

14. The phase-locked loop, as recited in claim 10, further comprising:
a counter configured to load a value of the phase difference signal after a frequency of the output signal reaches a target frequency in response to a detection of the catastrophic cycle-slip event and configured to decrement the value in response to incremental adjustment of the phase difference signal.

15. The phase-locked loop, as recited in claim 10, wherein the monitor is further configured to detect the out-of-frequency event based on a frequency difference between a frequency of the input clock signal and a frequency threshold value.

16. The phase-locked loop, as recited in claim 15, wherein the frequency difference is less than a threshold frequency difference for an out-of-frequency event.

17. The phase-locked loop, as recited in claim 10, further comprising:
a first time-to-digital converter configured to generate a first digital signal indicative of a first frequency of the input clock signal; and
a second time-to-digital converter configured to generate a second digital signal indicative of a second frequency of the feedback clock signal,
wherein the monitor detects the absence of the out-of-frequency event based on the first digital signal, and
wherein the phase detector uses the first digital signal and the second digital signal to generate the phase difference signal.

18. The phase-locked loop, as recited in claim 10, further comprising:
a time-to-digital converter configured to periodically generate a digital frequency signal; and
a comparator configured to generate an out-of-frequency signal based on another frequency-stable input clock signal and the digital frequency signal.

19. An apparatus for handling a frequency change of an input clock signal, the apparatus comprising:
means for detecting a catastrophic cycle slip event of a phase difference signal in the absence of an out-of-frequency event in a phase-locked loop; and
means for transitioning an output clock signal from a first frequency to a second frequency in response to detection of the catastrophic cycle slip event in the absence of an out-of-frequency event in the phase-locked loop.

20. The apparatus, as recited in claim 19, further comprising:
means for gradually aligning a first phase of a feedback clock signal to a second phase of the input clock signal after transitioning the output clock signal from the first frequency to the second frequency.

21. The method, as recited in claim 1, further comprising:
enabling a holdover mode of operating the phase-locked loop or switching a source of the input clock signal responsive to detection of the out-of-frequency event.

* * * * *